US007354631B2

(12) United States Patent
Fuss et al.

(10) Patent No.: US 7,354,631 B2
(45) Date of Patent: Apr. 8, 2008

(54) CHEMICAL VAPOR DEPOSITION APPARATUS AND METHODS

(75) Inventors: Jeff N. Fuss, Meridian, ID (US); Kevin T. Hamer, Meridian, ID (US); Zhiping Yin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 501 days.

(21) Appl. No.: 10/704,315

(22) Filed: Nov. 6, 2003

(65) Prior Publication Data

US 2005/0098105 A1 May 12, 2005

(51) Int. Cl.
*H05H 1/24* (2006.01)
*C23C 16/00* (2006.01)

(52) U.S. Cl. ................ 427/569; 427/248.1; 427/249.1; 427/249.5

(58) Field of Classification Search ..................... None
See application file for complete search history.

(56) References Cited

U.S. PATENT DOCUMENTS 4,382,100 A 5/1983 Holland
4,436,797 A 3/1984 Brady et al.
4,510,176 A 4/1985 Cuthbert et al.
4,675,265 A 6/1987 Kazama et al.
4,732,785 A 3/1988 Brewer
4,816,113 A * 3/1989 Yamazaki .................. 134/1.1
4,886,728 A 12/1989 Salamy et al.
4,994,404 A 2/1991 Sheng et al.
5,198,263 A * 3/1993 Stafford et al. ............. 427/577
5,260,236 A * 11/1993 Petro et al. ................. 438/786
5,433,794 A 7/1995 Fazan et al.
5,508,368 A * 4/1996 Knapp et al. ............... 427/534
5,656,128 A 8/1997 Hashimoto et al.
5,679,215 A * 10/1997 Barnes et al. ................ 134/1.1
5,754,390 A 5/1998 Sandhu et al.
5,788,778 A * 8/1998 Shang et al. ................... 134/1
5,814,433 A 9/1998 Nelson et al.
5,952,050 A 9/1999 Doan (Continued)

FOREIGN PATENT DOCUMENTS

JP 11-214290 8/1999

OTHER PUBLICATIONS

U.S. Appl. No. 10/661,379 Zhiping et al. filed Sep. 12, 2003.

(Continued)

*Primary Examiner*—Timothy Meeks
*Assistant Examiner*—Kelly M Stouffer
(74) *Attorney, Agent, or Firm*—Wells St. John P.S.

(57) ABSTRACT

This invention includes chemical vapor deposition apparatus, methods of chemical vapor depositing an amorphous carbon comprising layer on a substrate, and methods of chemical vapor depositing at least one of $Si_3N_4$ and $Si_xO_yN_z$ on a substrate. In certain implementations, a gas output manifold having at least one gas output to a deposition chamber and at least three gas inputs is utilized. In certain implementations, a remote plasma generator is utilized. In certain implementations, at least one cleaning gas input line feeds the remote plasma generator. In certain implementations, the at least one cleaning gas input line includes an amorphous carbon cleaning gas input and an $Si_3N_4$ or $Si_xO_yN_z$ cleaning gas input.

60 Claims, 2 Drawing Sheets

U.S. PATENT DOCUMENTS

| | | | |
|---|---|---|---|
| 6,188,097 | B1 | 2/2001 | Derderian et al. |
| 6,211,033 | B1 | 4/2001 | Sandhu et al. |
| 6,218,237 | B1 | 4/2001 | Sandhu et al. |
| 6,238,994 | B1 | 5/2001 | Derderian et al. |
| 6,297,112 | B1 | 10/2001 | Lin et al. |
| 6,306,702 | B1 | 10/2001 | Hao et al. |
| 6,333,255 | B1 | 12/2001 | Sekiguchi |
| 6,342,423 | B1 | 1/2002 | Ishida et al. |
| 6,344,396 | B1 | 2/2002 | Ishida et al. |
| 6,368,986 | B1 | 4/2002 | Budge et al. |
| 6,369,431 | B1 | 4/2002 | Gonzalez et al. |
| 6,376,284 | B1 | 4/2002 | Gonzalez et al. |
| 6,395,602 | B2 | 5/2002 | Sandhu et al. |
| 6,399,982 | B1 | 6/2002 | Derderian et al. |
| 6,453,916 | B1 | 9/2002 | Tran et al. |
| 6,472,283 | B1 | 10/2002 | Ishida et al. |
| 6,475,868 | B1 | 11/2002 | Hao et al. |
| 6,495,312 | B1 | 12/2002 | Young et al. |
| 6,500,756 | B1 | 12/2002 | Bell et al. |
| 6,524,775 | B1 | 2/2003 | Oberlander et al. |
| 6,555,432 | B2 | 4/2003 | Sandhu et al. |
| 6,559,017 | B1 | 5/2003 | Brown et al. |
| 6,605,514 | B1 | 8/2003 | Tabery et al. |
| 6,608,343 | B2 | 8/2003 | Derderian et al. |
| 6,617,230 | B2 | 9/2003 | Budge et al. |
| 6,653,220 | B2 | 11/2003 | Ma et al. |
| 6,653,733 | B1 | 11/2003 | Gonzalez et al. |
| 6,670,713 | B2 | 12/2003 | Gonzalez et al. |
| 6,700,211 | B2 | 3/2004 | Gonzalez et al. |
| 6,750,127 | B1 | 6/2004 | Chang et al. |
| 6,875,664 | B1 | 4/2005 | Huang et al. |
| 2001/0023123 | A1 | 9/2001 | Kim |
| 2002/0011210 | A1* | 1/2002 | Satoh et al. ................ 118/715 |
| 2002/0088707 | A1 | 7/2002 | Towle |
| 2002/0132451 | A1 | 9/2002 | Akino et al. |
| 2002/0185687 | A1 | 12/2002 | Koh et al. |
| 2003/0001187 | A1 | 1/2003 | Basceri et al. |
| 2003/0011011 | A1 | 1/2003 | Basceri et al. |
| 2003/0045121 | A1 | 3/2003 | Higashi |
| 2003/0073309 | A1 | 4/2003 | Emami |
| 2004/0032031 | A1 | 2/2004 | Holscher et al. |
| 2004/0043574 | A1 | 3/2004 | Steiner et al. |
| 2004/0043626 | A1* | 3/2004 | Chou San et al. .......... 438/758 |
| 2004/0259355 | A1* | 12/2004 | Yin et al. .................. 438/689 |
| 2005/0042879 | A1 | 2/2005 | Yin et al. |
| 2005/0059262 | A1* | 3/2005 | Yin et al. .................. 438/780 |
| 2005/0255702 | A1 | 11/2005 | Honeycutt et al. |

OTHER PUBLICATIONS

U.S. Appl. No. 10/661,100 Sandhu et al. filed Sep. 12, 2003.
U.S. Appl. No. 10/463,185 Yin et al. filed Jun. 17, 2003.
PCT/US2004/026517; Filed Aug. 22, 2004; International Search Report; 4 pps.
PCT/US04/026517 Written Opinion, 6 pages (Jan. 2005).

* cited by examiner

CHEMICAL VAPOR DEPOSITION APPARATUS AND METHODS

TECHNICAL FIELD

This invention relates to chemical vapor deposition apparatus, to methods of chemical vapor depositing an amorphous carbon comprising layer on a substrate, and to methods of chemical vapor depositing at least one of $Si_3N_4$ and $Si_xO_yN_z$ on a substrate.

BACKGROUND OF THE INVENTION

Integrated circuits are typically formed on a semiconductor substrate, such as a silicon wafer or other semiconducting material. In general, layers of various materials which are either semiconducting, conducting or insulating are utilized to form the integrated circuits. By way of example, the various materials are doped, ion implanted, deposited, etched, grown, etc. using various processes. Further, a continuing goal in semiconductor processing is to continue to strive to reduce the size of individual electronic components, thereby enabling smaller and denser integrated circuitry.

One technique for patterning and processing semiconductor substrates is photolithography. Such typically includes deposition of a photoresist layer which can be processed to modify the solubility of such layer in certain solvents. For example, portions of the photoresist layer can be exposed through a mask/reticle to change the solvent solubility of the exposed regions versus the unexposed regions compared to the as-deposited state. Thereafter, the exposed or unexposed portions can be removed depending on the type of photoresist thereby leaving a masking pattern of the photoresist on the substrate. Adjacent areas of the substrate next to the masked portions can be processed, for example by etching or ion implanting, to effect the desired processing of the substrate adjacent the masking material.

In certain instances, multiple different layers of photoresist are utilized in a given masking/photolithographic step. Further, the photolithographic masking and patterning might be combined with one or more other layers. One such process forms what is commonly referred to as a "hard mask" over the substrate prior to deposition of the photoresist layer or layers. The photoresist layer is then patterned, for example as described above, to form masking blocks over the hard mask. The hard mask is then etched using the photoresist as a mask to transfer the pattern of the photoresist to the hard mask. The photoresist may or may not be removed immediately thereafter. Hard masks such as just described provide a more robust masking pattern than photoresist alone, for example should the photoresist be completely eroded/etched away.

One material utilized as a hard mask is amorphous carbon. The amorphous carbon might be doped with other materials, for example boron and/or nitrogen. When etching oxide material using an amorphous carbon as a hard mask, the etching typically removes the oxide at a rate of about ten times faster than it removes amorphous carbon.

In many instances, it is desirable to use an antireflective coating (with or without a hard mask) over which the photoresist is deposited. In the absence of an antireflective coating, some underlying substrates reflect a considerable amount of the incident radiation which can adversely affect the patterning of the photoresist. Accordingly even when using amorphous carbon hard mask patterning, an antireflective coating would typically be employed intermediate the amorphous carbon and the photoresist layer. The antireflective coating might be composed of a single layer, or multiple layers. For example, one antireflective coating might be inorganic, and another antireflective coating might be, organic. For example in one implementation, an antireflective coating over amorphous carbon comprises a first inorganic layer and a second organic layer. The second organic layer might be utilized where the first antireflective inorganic layer does not provide the desired antireflective effect when used alone. Regardless, photoresist is deposited thereafter, and then typically patterned using wet solvent processing to form openings through the photoresist to the antireflective layer(s). The mask pattern in the photoresist layer is then typically transferred through the antireflective layer(s), and through the amorphous carbon layer, utilizing one or more dry anisotropic etching techniques. Then, one or more suitable different chemistries are typically utilized to extend the openings through the layer or layers inwardly of the amorphous carbon layer.

One common inorganic anti-reflective coating material is silicon oxynitride. The typical equipment utilized in depositing amorphous carbons and in depositing silicon oxynitrides are two chemical vapor deposition tools largely due to the different deposition precursor gases and different cleaning issues and gases associated with the two different depositions. Accordingly, different chemical vapor deposition chambers with their own different respective process kit hardware have been utilized in depositing these layers.

The invention was motivated in addressing and improving upon the above-described issues. However, it is in no way so limited. The invention is only limited by the accompanying claims as literally worded (without interpretative or other limiting reference to the above background art description, remaining portions of the specification or the drawings), and in accordance with the doctrine of equivalents.

SUMMARY

This invention relates to chemical vapor deposition apparatus, to methods of chemical vapor depositing an amorphous carbon comprising layer on a substrate, and to methods of chemical vapor depositing at least one of $Si_3N_4$ and $Si_xO_yN_z$ on a substrate. In one implementation, a chemical vapor deposition apparatus includes a deposition chamber configured to receive a substrate to be deposited upon. The apparatus also includes a remote plasma generator. A gas output manifold is in fluid communication with the deposition chamber. The gas output manifold comprises at least one gas output to the deposition chamber and at least three gas inputs. The at least three gas inputs comprise a first gas input line fed by at least a nitrogen deposition precursor source line, a silicon deposition precursor source line, and an oxygen deposition precursor source line effective to deposit at least one of $Si_3N_4$ and $Si_xO_yN_z$ on a substrate received within the deposition chamber and over at least some deposition chamber internal surfaces. One of the gas inputs comprises a second gas input line which is fed by at least one carbon deposition precursor source line effective to deposit an amorphous carbon comprising material on a substrate received with the deposition chamber surface and over at least some deposition chamber internal surfaces. One of the gas inputs comprises a third gas input line which is fed by the remote plasma generator. At least one cleaning gas input line feeds the remote plasma generator. The at least one cleaning gas input line comprises an amorphous carbon cleaning gas input and an $Si_3N_4$ or $Si_xO_yN_z$ cleaning gas input.

In one implementation, a method of chemical vapor depositing an amorphous carbon comprising layer on a substrate comprises providing a deposition tool comprising a deposition chamber, a gas output manifold in upstream fluid communication with the deposition chamber, and a remote plasma generator in upstream fluid communication with the gas output manifold. A substrate is positioned within the deposition chamber. A carbon comprising gas is flowed to the gas output manifold effective to deposit an amorphous carbon comprising layer on the substrate within the deposition chamber and over at least some deposition chamber internal surfaces. After depositing the amorphous carbon comprising layer, the substrate is removed from the deposition chamber. Thereafter, an oxygen containing cleaning gas is flowed through the remote plasma generator, into the gas output manifold and into the deposition chamber, and a plasma is generated within the deposition chamber with the oxygen containing cleaning gas effective to remove at least some of the amorphous carbon from the deposition chamber internal surfaces.

In one implementation, a method of chemical vapor depositing at least one of $Si_3N_4$ and $Si_xO_yN_z$ on a substrate comprises providing a deposition tool comprising a deposition chamber, a gas output manifold in upstream fluid communication with the deposition chamber, and a remote plasma generator in upstream fluid communication with the gas output manifold. The gas output manifold comprises at least one gas output to the deposition chamber and at least three gas inputs. The at least three gas inputs comprises a first gas input line fed by at least a nitrogen deposition precursor source line, a silicon deposition precursor source line, and an oxygen deposition precursor source line. One of the gas inputs comprises a second gas input line fed by at least one carbon deposition precursor source line. One of the gas inputs comprises a third gas input line fed by the remote plasma generator. At least one cleaning gas input line feeds the remote plasma generator, and comprises an amorphous carbon cleaning gas input and an $Si_3N_4$ or $Si_xO_yN_z$ cleaning gas input. A substrate is positioned within the deposition chamber. A silicon deposition precursor and at least one of a nitrogen deposition precursor and an oxygen deposition precursor are flowed through the first gas input line to the gas output manifold effective to deposit at least one of $Si_3N_4$ and $Si_xO_yN_z$ on the substrate within the deposition chamber and over at least some deposition chamber internal surfaces.

In one implementation, a method of chemical vapor depositing an amorphous carbon comprising layer on a substrate and at least one of $Si_3N_4$ and $Si_xO_yN_z$ on a substrate, comprises:

(a) positioning a substrate within a deposition chamber;

(b) depositing a layer comprising at least one of $Si_3N_4$ and $Si_xO_yN_z$ over the substrate within the deposition chamber and over at least some deposition chamber internal surfaces;

(c) depositing a layer comprising amorphous carbon over the substrate within the deposition chamber and over at least some deposition chamber internal surfaces, with (b) and (c) occurring prior to any removing of the substrate from the deposition chamber;

(d) after (b) and after (c), removing the substrate from the deposition chamber;

(e) after removing the substrate from the deposition chamber, removing at least some of the at least one of $Si_3N_4$ and $Si_xO_yN_z$ from the deposition chamber internal surfaces with a $Si_3N_4$ and $Si_xO_yN_z$ cleaning gas at subatmospheric pressure; and (f) after removing the substrate from the deposition chamber, removing at least some of the amorphous carbon comprising layer from the deposition chamber internal surfaces with an amorphous carbon comprising cleaning gas at subatmospheric pressure, with (e) and (f) occurring prior to any exposure of the deposition chamber to room atmospheric pressure after (d).

Other implementations and aspects are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention encompasses various chemical vapor deposition apparatus and various methods of chemical vapor depositing materials on substrates received within chemical vapor deposition chambers. The apparatus aspects are not limited by any method aspects, nor are any method aspects limited by apparatus aspects, unless language pertinent thereto is literally, expressly provided within a claim under analysis. Accordingly, the method aspects and apparatus aspects are not to be cross-read relative to one another unless language pertinent to the other is literally expressed in a claim under analysis.

Figure 1:
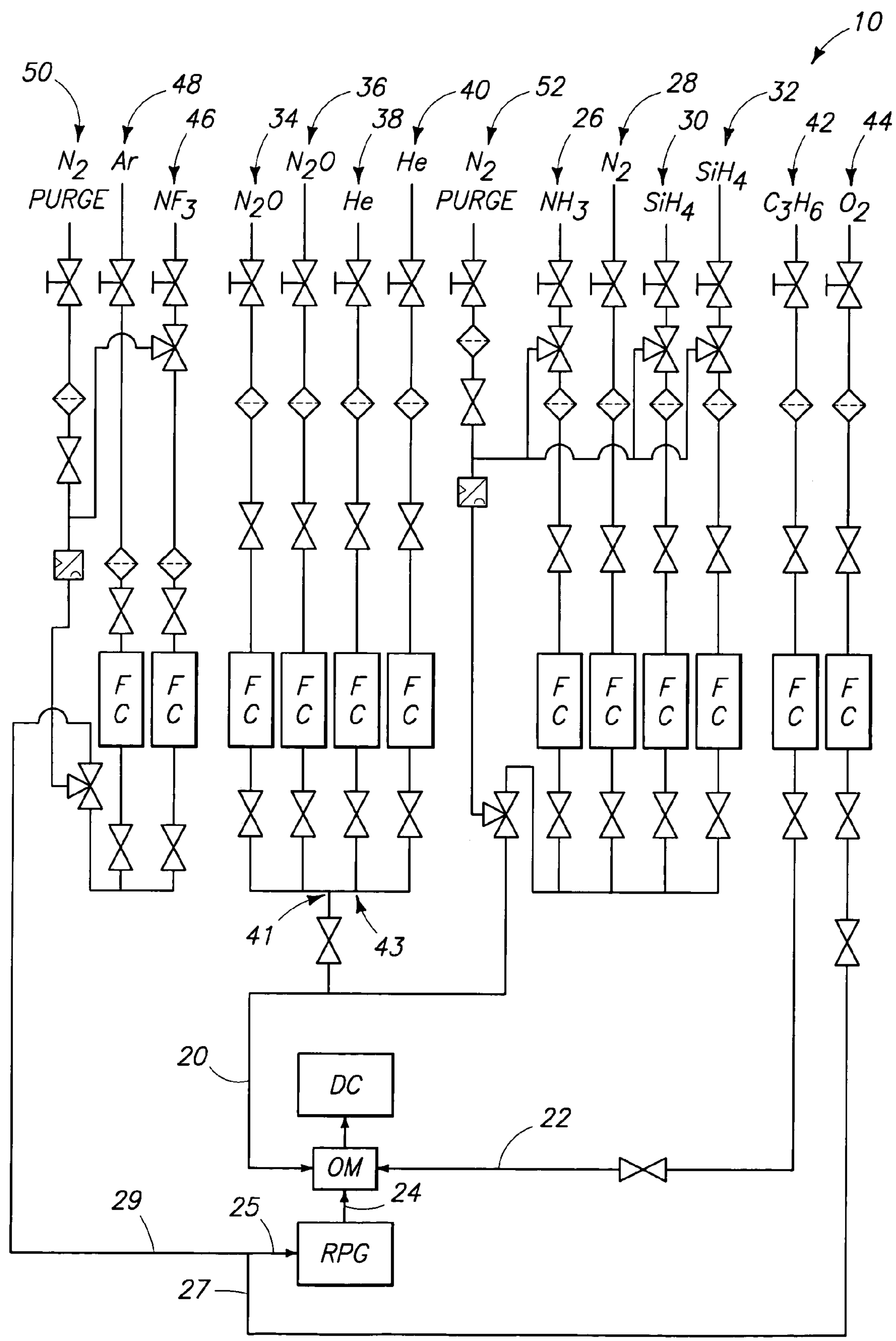
FIG. 1 is a diagrammatic schematic of a chemical vapor deposition apparatus in accordance with an aspect of the invention.

A first embodiment chemical vapor deposition apparatus is indicated generally with reference numeral 10 in FIG. 1. Such schematically depicts the various plumbing associated in the preferred embodiment. By way of example and not of limitation, the depicted opposing pairs of apex touching triangles constitute valves, and the depicted diamonds or squares having horizontal diagonal dashed lines extending thereacross constitute filters. The depicted squares having full diagonal lines are flow gauges. The valves with the left laterally extending T's are exemplary manually controlled valves, where the other valves are ideally pneumatically controlled. The depicted row of rectangles independently labeled FC are flow controllers sized or otherwise configured to provide desired precisely controlled flow rates of gases therethrough.

Figure 2:
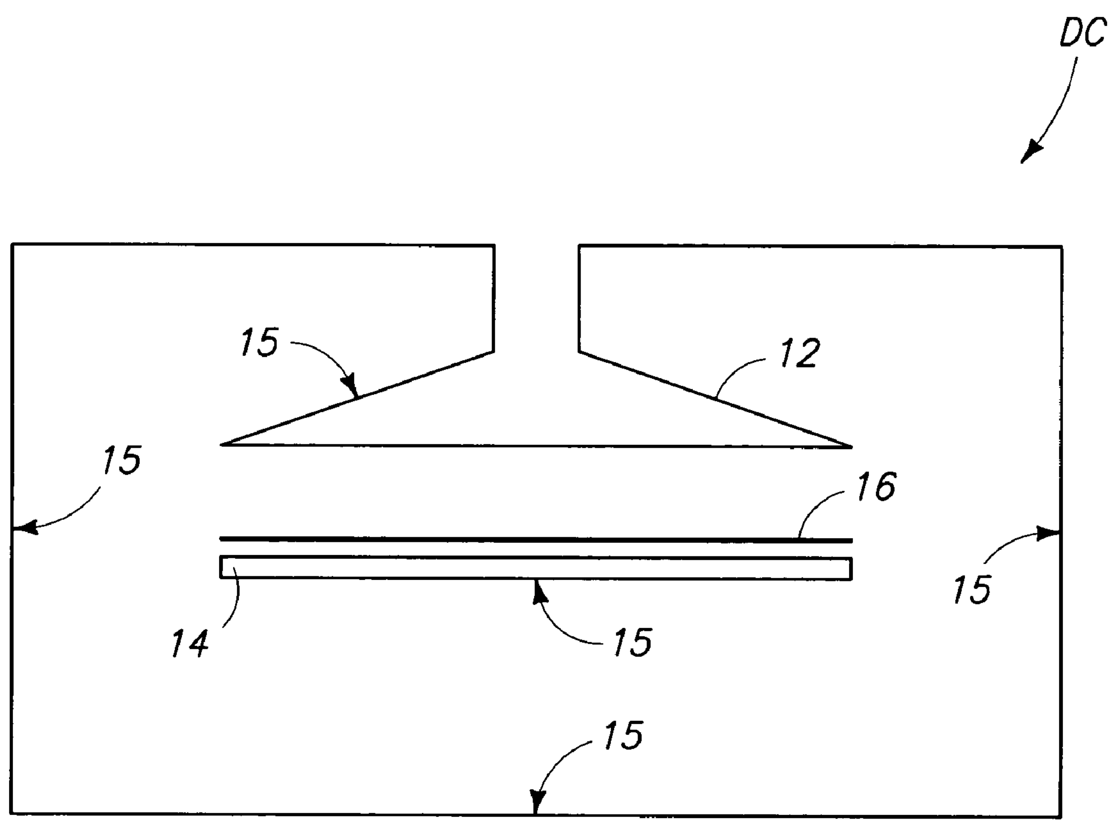
FIG. 2 is an enlarged diagrammatic representation of a preferred embodiment portion of the preferred embodiment chemical vapor deposition apparatus of FIG. 1.

Chemical vapor deposition apparatus 10 comprises a deposition chamber DC configured to receive a substrate to be deposited upon. By way of example only, FIG. 2 diagrammatically depicts an exemplary deposition chamber DC having a substrate support 14 over which a substrate 16 to be deposited upon is received. An exemplary preferred substrate is a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Deposition chamber DC includes a gas showerhead 12 received therein for emitting deposition and/or cleaning gases to within the chamber. Deposition chamber DC can be considered as having internal surfaces 15 comprising internal exposed sidewalls defining the chamber volume within which substrate 16 is deposited upon as well as surfaces of process kit hardware received within such internal volume. An exemplary internal volume for a single chamber DC is 6.75 liters.

In one preferred embodiment, apparatus 10 is a plasma enhanced chemical vapor deposition apparatus comprising at least one plasma generating electrode within deposition chamber DC, preferably an RF generator. By way of example only, showerhead 12 can be configured to be a plasma generating electrode, and support 14 can either be powered or connected to ground, or even allowed to have its potential float when plasma generation might be utilized. Grounding of support 14 is preferred.

Chemical vapor deposition apparatus 10 includes a remote plasma generator RPG (FIG. 1). Apparatus 10 also includes a gas output manifold OM which is in fluid communication with deposition chamber DC. The gas output manifold comprises at least one gas output to deposition chamber DC and at least three gas inputs. FIG. 1 depicts the exemplary gas inputs where the arrowheads pointing to gas output manifold OM contact the diagrammatic depicted box, with the gas output being depicted where the line with an arrowhead pointing to deposition chamber DC contacts with and extends from gas output manifold box OM. In the illustrated and preferred embodiment, gas output manifold OM has only three gas inputs and only one gas output.

Gas output manifold OM might be received internally within or externally of deposition chamber DC. Most preferred is receipt of the output manifold externally of deposition chamber DC. Regardless in the preferred embodiment, gas output manifold DC feeds to showerhead 12 within deposition chamber DC, although a showerhead is in no way required in all aspects of the invention. Further, a "gas output manifold" as utilized in the context of this document does not encompass a deposition chamber showerhead.

The at least three gas inputs of gas output manifold OM comprise a first gas input line 20, a second gas input line 22, and a third gas input line 24. First gas input line 20 is fed by at least a nitrogen deposition precursor source line, a silicon deposition precursor source line, and an oxygen deposition precursor source line effective to deposit at least one of $Si_3N_4$ and $Si_xO_yN_z$ on a substrate received within deposition chamber DC as well as over at least some of deposition chamber internal surfaces 15. In the context of this document unless otherwise limited, "x" is a real number greater than zero, "y" is a real number greater than zero, and "z" is a real number greater than or equal to zero in the $Si_xO_yN_z$ designation. Further throughout this document, use of $Si_3N_4$ and $Si_xO_yN_z$ does not preclude incorporation of other materials in the deposited layer. For example, and by way of example only, hydrogen might be incorporated in the formation of hydrogenated silicon rich silicon oxide and/or silicon rich silicon oxynitride.

Further in reduction to practice examples, two output manifolds OM fed two deposition chambers DC, with lines 20, 22 and 24 splitting to feed two output manifolds OM. Accordingly, the exemplary preferred flow rates provided below are for a two 6.75 liter chambers DC fed in parallel by two gas output manifolds OM.

By way of example only, flow lines 26 and 28 with their associated illustrated hardware comprise exemplary nitrogen deposition precursor source lines. An exemplary flow controller FC for line 26 is a nominal 500 sccm flow controller for preferably controlling $NH_3$ flow at from 50 sccm to 450 sccm during a deposition. An exemplary flow controller FC for line 28 is nominally 10 slm for preferably regulating $N_2$ flow at from 500 sccm to 9.5 slm during a deposition.

An exemplary silicon deposition precursor source line is either of lines 30 and 32 designated, by way of example only, for feeding silane. Different silicon deposition precursor source lines, or other deposition precursor source lines of the same composition, might be provided for precisely controlling different flow rates at different time during a deposition. For example, and by way of example only, an exemplary flow rate for one of the depicted flow controllers FC is a nominal 300 sccm controller preferably operable from 30 sccm to 270 sccm during a deposition, with the other depicted flow controller FC being an exemplary nominal 1000 sccm flow controller preferably operable from 100 sccm to 900 sccm.

An exemplary oxygen deposition precursor source line is either of lines 34 and 36 and their associated hardware, depicting by way of example only an oxygen deposition precursor source as being $N_2O$. Exemplary preferred flow rates for two different flow controllers FC associated with lines 34 and 36 are a nominal 500 sccm controller for a preferred flow rate control between 50 sccm and 450 sccm, and a nominal 5 slm flow controller for a preferred flow between 500 sccm and 4.5 slm.

Preferred embodiment chemical vapor deposition apparatus 10 also includes a first inert deposition process gas source line 38 which feeds first gas input line 20. Alternately or additionally considered, line 28 might be utilized as a first inert deposition process gas source line. In the context of this document, an "inert deposition process gas" is a gas utilized in a deposition process but is inert to contributing appreciable material that deposits into the layer being formed within deposition chamber DC. By way of example only, FIG. 1 depicts first inert deposition process gas source line 38 as connecting with a helium source. Further by way of example only, an exemplary flow controller FC for line 38 is a nominal 5 slm controller, preferably for regulating helium flow at from 500 sccm to 4.5 slm. For example, and by way of example only, consider deposition of $Si_xO_yN_z$ where each of x, y and z are greater than zero. Exemplary deposition gas flows include $N_2O$, $SiH_4$, $NH_3$, and He from a suitable combination of the depicted and referred to source lines. $N_2$ from line 28 might additionally be utilized with or in place of He from line 38. Further by way of example only, where the deposited material was to be $Si_3N_4$, exemplary gas flows during the deposition include $N_2$, $NH_3$ and $SiH_4$ from a suitable combination of the depicted and referred to source lines.

The preferred embodiment chemical vapor deposition apparatus 10 also preferably comprises a second inert deposition process gas source line 40 preferably configured for a lower inert flow rate than first inert deposition process gas source line 38 and line 28 are configured. By way of example only, an exemplary flow controller FC for line 40 is a nominal 1000 sccm flow controller, preferably configured to precisely control flow of helium therethrough at from 100 sccm to 900 sccm during a deposition. An exemplary non-limiting reason or purpose for second inert deposition process gas source line 40 is provided below.

In the depicted preferred embodiment, second inert deposition precursor gas source line 40 joins with oxygen deposition precursor source line 34 and/or 36 upstream of first gas input line 20, for example at a location 41. Further, second inert deposition process gas source line 40 joins with first inert deposition process gas source line 38 upstream of first gas input line 20, for example at a location 43.

Second gas input line 22 is fed by at least one carbon deposition precursor source line effective to deposit an amorphous carbon comprising material on a substrate received within the deposition chamber and also over at least some deposition chamber internal surfaces 15. Source line 42 is one exemplary carbon deposition precursor source line, with the depicted exemplary carbon deposition precursor being a hydrocarbon, more specifically $C_3H_6$. In one preferred embodiment, carbon deposition precursor source line 42 is operable with second inert deposition process gas source line 40 in a manner effective to deposit an amorphous carbon comprising material within the deposition chamber, and preferably an amorphous carbon comprising material which is transparent to visible light, and as will be more fully developed below. Typically, deposition of an amorphous carbon comprising layer utilizes a lower inert deposition process gas flow rate than an inert deposition process gas flow rate occurring during deposition of $Si_xO_yN_z$ where z is greater than zero. Further by way of example only, an exemplary flow-controller FC for line 42 is a nominal 3 slm controller, preferably for regulating $C_3H_6$ flow at from 300 sccm to 2.7 slm.

Third gas input line 24 is fed by remote plasma generator RPG. At least one cleaning gas input line 25 feeds remote plasma generator RPG. The at least one cleaning gas input line 25 comprises an amorphous carbon cleaning gas input 27 and an $Si_3N_4$ or $Si_xO_yN_z$ cleaning gas input 29. Inputs 27 and 29 could also be considered as constituting cleaning gas input lines that, if desired, could connect directly with remote plasma generator RPG as compared to joining into a line 25 as is shown. In the illustrated preferred embodiment, only one cleaning gas input line 25 feeds remote plasma generator RPG.

Amorphous carbon cleaning gas input 27 is depicted as comprising an oxygen, here $O_2$, source line 44 for feeding oxygen as the amorphous carbon cleaning gas. By way of example only, an exemplary flow controller FC for line 44 is a nominal 3 slm controller, preferably for regulating $O_2$ flow at from 300 sccm to 2.7 slm. The illustrated $Si_3N_4$ or $Si_xO_yN_z$ cleaning gas input 29 comprises a cleaning gas source line 46 depicted as feeding $NF_3$ as a $Si_3N_4$ or $Si_xO_yN_z$ cleaning gas. By way of example only, an exemplary flow controller FC for line 46 is a nominal 3 slm controller, preferably for regulating $NF_3$ flow at from 300 sccm to 2.7 slm. An inert cleaning gas line 48 is also depicted which would typically flow with the $NF_3$ during cleaning of $Si_3N_4$ or $Si_xO_yN_z$ from deposition chamber DC. By way of example only, an exemplary flow controller FC for line 48 is a nominal 5 slm controller, preferably for regulating Ar flow at from 500 sccm to 4.5 slm. $N_2$ purge lines 50 and 52 are depicted, and would typically not be utilized during deposition or cleaning as described above.

Aspects of the invention also encompass methods of chemical vapor depositing an amorphous carbon comprising layer on a substrate, a method of chemical vapor depositing at least one of $Si_3N_4$ and $Si_xO_yN_z$ on a substrate, and depositing both an amorphous carbon comprising layer and at least one of $Si_3N_4$ and $Si_xO_yN_z$ on a substrate. In one implementation, a method of chemical vapor depositing an amorphous carbon comprising layer on a substrate includes providing a deposition tool comprising a deposition chamber, a gas output manifold in upstream fluid communication with the deposition chamber, and a remote plasma generator in upstream fluid communication with the gas output manifold. By way of example only in this methodical context, FIG. 1 depicts such an exemplary deposition tool 10.

A substrate is positioned within the deposition chamber, for example deposition chamber DC. A carbon comprising gas is flowed to the gas output manifold effective to deposit an amorphous carbon comprising layer on the substrate within the deposition chamber and over at least some deposition chamber internal surfaces. The amorphous carbon comprising layer might be doped with other materials (i.e., boron and/or nitrogen) or be undoped, and regardless most preferably is deposited from a carbon comprising gas comprising a hydrocarbon, with the amorphous carbon comprising layer being transparent to visible light. Preferably, such is accomplished by forming the amorphous carbon comprising layer to have a low absorption coefficient. For example, the visible light range is an optical range of the electromagnetic spectrum having light/electromagnetic radiation which is visible to human eyes. The visible light range includes any light having a wavelength between about 400 nm (nanometers) and about 700 nm. The non-visible light range is the range of the entire electromagnetic spectrum minus the visible light range. Some examples of the non-visible light range include electromagnetic radiations with wavelengths between 700 nm and 1 millimeter (infrared light), wavelengths between 10 nm and 400 nm (ultraviolet light), and wavelengths between 0.01 nm and 10 nm (X-ray).

In the context of this document, an amorphous carbon comprising layer that is transparent to visible light means that the amorphous carbon comprising layer has a substantially low absorption coefficient (k) in which k has a range between about 0.15 and about 0.001 at wavelength 633 nm. The amorphous carbon comprising layer transparent to visible light range radiation by way of example only might be formed at a temperature from about 200° C. to about 450° C., with an exemplary preferred pressure range being from about 3 Torr to about 7 Torr. A specific preferred example is 375° C. and 5 Torr. Such deposition preferably occurs by plasma generation, with an exemplary power applied to the showerhead being from 500 watts to 1100 watts, with 800 watts being a specific preferred example. An exemplary flow rate for the $C_3H_6$ is from 400 sccm to 2400 sccm, with 1450 sccm being a specific preferred example. An exemplar preferred flow rate for the helium is from 250 sccm to 650 sccm, with 450 sccm being a specific preferred example. An exemplary preferred spacing of the showerhead/substrate support-susceptor is 240 mils. Exemplary additional or other hydrocarbon gases utilizable in producing transparency as described include $CH_4$, $C_2H_2$, $C_2H_4$, $C_2H_6$, and $C_3H_8$. A preferred gas provided during such deposition might be either one gas or a combination of various gases, including the absence of any helium. Further, lower temperature depositions can result in greater transparency than higher temperature depositions. Exemplary plots of various parameters as a function of deposition temperature and wavelength are shown in our co-pending U.S. patent application Ser. No. 10/661,379 filed on Sep. 12, 2003, entitled "Transparent Amorphous Carbon Structure In Semiconductor Devices", naming Weimin Li and Zhiping Yin as inventors, (which became U.S. Patent Publication No. 2005/0059262), as depicted in FIGS. 1B, 1C, 1D, and 1E, and the text pertaining thereto. By way of example only, an exemplary deposition thickness over the substrate for the amorphous carbon comprising layer is 4000 Angstroms. If boron and/or nitrogen doping of the amorphous carbon comprising layer is desired, an exemplary boron source gas is $B_2H_6$ at an exemplary flow rate of 1500 sccm, and an exemplary nitrogen source gas is $N_2$ at an exemplary flow rate of 1000 sccm. Where boron doping is desired, an exemplary concentration range in the layer for boron is from 0.5% atomic to 60% atomic. Where nitrogen doping is desired, an exemplary concentration range in the layer for nitrogen is from 0.1% atomic to 20% atomic.

After depositing the amorphous carbon comprising layer, the substrate is removed from the deposition chamber. Thereafter, an oxygen containing cleaning gas is flowed through the remote plasma generator, into the gas output manifold, and into the deposition chamber. A plasma is generated within the deposition chamber with the oxygen containing cleaning gas effective to remove at least some of the amorphous carbon from the deposition chamber internal surfaces. By way of example only, line 44 in FIG. 1 could be utilized for flowing the oxygen containing cleaning gas as stated. In one embodiment, the remote plasma generator does not generate plasma during the oxygen containing cleaning gas flow therethrough. In another but lesser preferred embodiment, the remote plasma generator generates plasma from and during the oxygen containing cleaning gas flowing therethrough, along with plasma generation within deposition chamber DC. Most preferably, the stated depositings and cleanings are conducted without breaking any vacuum within the deposition chamber, and/or without exposing the deposition chamber to atmospheric conditions.

In another implementation, a method of chemical vapor depositing an amorphous carbon comprising layer on a substrate includes providing a deposition tool comprising a deposition chamber, a gas output manifold in upstream fluid communication with the deposition chamber, and a remote plasma generator in upstream fluid communication with the gas output manifold. The gas output manifold comprises at least one gas output to the deposition chamber and at least three gas inputs. The at least three inputs comprise a first gas input line fed by at least a nitrogen deposition precursor source line, a silicon deposition precursor source line, and an oxygen deposition precursor source line. One of the at least three gas inputs comprises a second gas input line fed by at least one carbon deposition precursor source line. Another of the three gas inputs comprises a third gas input line fed by the remote plasma generator. At least one cleaning gas input line feeds the remote plasma generator, with such comprising an amorphous carbon cleaning gas input and an $Si_3N_4$ or $Si_xO_yN_z$ cleaning gas input. By way of example only, the chemical vapor deposition apparatus 10 of FIG. 1 is but one exemplary deposition tool utilizable in accordance with this aspect of the invention.

A substrate is positioned within the deposition chamber. Thereafter, a carbon comprising gas is flowed to the gas output manifold through the second gas input effective to deposit an amorphous carbon comprising layer on the substrate within the deposition chamber and over at least some deposition chamber internal surfaces. Preferred carbon comprising gases and attributes of the amorphous carbon comprising layer are otherwise as described above.

Aspects of the invention and another implementation comprise a method of chemical vapor depositing: at least one of $Si_3N_4$ and $Si_xO_yN_z$ on a substrate. In such implementation, provided is a deposition tool comprising a deposition chamber, a gas output manifold in upstream fluid communication with the deposition chamber, and a remote plasma generator in upstream fluid communication with the gas output manifold. The gas output manifold comprises at least one gas output to the deposition chamber and at least three gas inputs. The at least three gas inputs include a first gas input line fed by at least a nitrogen deposition precursor source line, a silicon deposition precursor source line, and an oxygen deposition precursor source line. The at least three gas inputs include a second gas input line fed by at least one carbon deposition precursor source line. The at least three gas inputs include a third gas input line fed by the remote plasma generator. At least one cleaning gas input line feeds the remote plasma generator, with such comprising an amorphous carbon cleaning gas input and a $Si_3N_4$ or $Si_xO_yN_z$ cleaning gas input. By way of example only, the chemical vapor deposition apparatus 10 depicted in FIG. 1 constitutes one such exemplary deposition tool usable in accordance with this methodical aspect of the invention.

A substrate is positioned within the deposition chamber. A silicon deposition precursor and at least one of a nitrogen deposition precursor and an oxygen deposition precursor are flowed through the first gas input line to the gas output manifold effective to deposit at least one of $Si_3N_4$ and $Si_xO_yN_z$ on the substrate within the deposition chamber and over at least some deposition chamber internal surfaces. In one implementation, hydrogen is incorporated with the at least one of $Si_3N_4$ and $Si_xO_yN_z$. In one implementation, the flowing is effective to deposit $Si_3N_4$. In one implementation, the flowing is effective to deposit $Si_xO_yN_z$. In one implementation, the flowing is effective to deposit $Si_xO_yN_z$ where z is greater than zero. A specific example of depositing $Si_xO_yN_z$ where z is greater than zero includes shower head—substrate support/susceptor spacing of 590 mils, power at 500 watts, support/susceptor temperature at 375° C., pressure at 4 Torr, $NH_3$ flow at 50 sccm, $N_2O$ flow at 229 sccm, $SiH_4$ flow at 192 sccm, and $N_2$ flow at 6.4 slm using the FIG. 1 equipment. A specific example of depositing $Si_3N_4$ includes shower head—substrate support/susceptor spacing of 520 mils, power at 785 watts, support/susceptor temperature at 375° C., pressure at 4.8 Torr, $NH_3$ flow at 190 sccm, $SiH_4$ flow at 480 sccm, and $N_2$ flow at 6.4 slm using the FIG. 1 equipment.

The invention also contemplates deposition of both a) an amorphous carbon comprising layer on a substrate and b) at least one of $Si_3N_4$ and $Si_xO_yN_z$ on a substrate. Such can be conducted separately as described above. Yet in another considered aspect, a method of depositing both comprises positioning a substrate within a deposition chamber. A layer comprising at least one of $Si_3N_4$ and $Si_xO_yN_z$ is deposited over the substrate within the deposition chamber and over at least some deposition chamber internal surfaces. A layer comprising amorphous carbon is deposited over the substrate within the deposition chamber and over at least some deposition chamber internal surfaces. The depositing of the layer comprising at least one of $Si_3N_4$ and $Si_xO_yN_z$ could occur before depositing of the amorphous carbon comprising layer, or after. The depositing of the layer comprising at least one of $Si_3N_4$ and $Si_xO_yN_z$, and the depositing of the amorphous carbon comprising layer, occur prior to any removing of the substrate from the deposition chamber once it has been positioned therein for depositing. The preferred methods of depositing such layers and other attributes are as described above.

After the stated depositings, the substrate is removed from the deposition chamber. Thereafter, at least some of the at least one of $Si_3N_4$ and $Si_xO_yN_z$ is removed from the deposition chamber internal surfaces with a suitable cleaning gas at subatmospheric pressure. Such cleaning gas is preferably subjected to remote plasma generation prior to flowing to the deposition chamber. Further after removing the substrate from the deposition chamber, at least some of the amorphous carbon comprising layer is removed from the deposition chamber internal surfaces with an amorphous carbon comprising cleaning gas at subatmospheric pressure. Any order of the respectively stated cleanings as just so stated is contemplated, and as might be decided based upon the order of deposition of the respective layers. Further, such stated cleanings occur prior to any exposure of the deposition chamber to room atmospheric pressure after the substrate has been removed from the chamber. By way of example only, exemplary preferred equipment utilizable in conducting the just stated method is the chemical vapor deposition apparatus of FIG. 1. Preferred attributes are otherwise as stated above, and for example also as specifically stated in claims 72-97 of this original filed priority patent application from which this patent matured, and which is not here repeated for brevity. The respective stated removings with the cleaning gases may be conducted after every wafer/substrate that is deposition processed in the deposition chamber (preferred), or only after some plurality of wafers/substrates have been deposition processed in the deposition chamber (less preferred).

All methodical aspects of the invention which were reduced-to-practice were done so utilizing the chemical vapor deposition apparatus of FIG. 1. Further, the apparatus aspects of this invention which were reduced-to-practice were done so by modifying an Applied Materials (of Santa Clara, Calif.) Producer CVD Apparatus specifically adapted for depositing inorganic dielectric anti-reflective coating materials. The prior art Applied Materials equipment encompassed the schematic of FIG. 1 with the exception of not including the associated hardware and flow lines of lines 40, 42 and 44, and having a different output manifold design. Further, two deposition chambers fed in parallel by two of the different output manifold designs are used in the original Applied Materials Producer CVD equipment.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of chemical vapor depositing an amorphous carbon-comprising layer on a substrate, comprising:

providing a deposition tool comprising a deposition chamber, a gas output manifold in upstream fluid communication with the deposition chamber, and a remote plasma generator in upstream fluid communication with the gas output manifold;

providing a substrate within the deposition chamber;

flowing a carbon-comprising gas to the gas output manifold effective to deposit an amorphous carbon-comprising layer on the substrate within the deposition chamber and over at least some deposition chamber internal surfaces;

after depositing the amorphous carbon-comprising layer, removing the substrate from the deposition chamber; and after removing the substrate from the deposition chamber, flowing an oxygen-containing cleaning gas through the remote plasma generator, into the gas output manifold and into the deposition chamber without generating a plasma of the oxygen-containing cleaning gas with the remote plasma generator, and generating a plasma within the deposition chamber with the oxygen-containing cleaning gas effective to remove at least some of the amorphous carbon from the deposition chamber internal surfaces.

2. The method of claim 1 wherein the carbon-comprising gas is a hydrocarbon and the amorphous carbon-comprising layer is transparent to visible light.

3. The method of claim 1 wherein the flowing the carbon-comprising gas is from the gas output manifold to a gas showerhead received within the deposition chamber.

4. The method of claim 1 wherein the gas output manifold is received externally of the deposition chamber.

5. The method of claim 1 wherein the flowing the carbon-comprising gas is from the gas output manifold to a gas showerhead received within the deposition chamber, and the gas output manifold is received externally of the deposition chamber.

6. The method of claim 1 wherein the oxygen-containing cleaning gas comprises $O_2$.

7. The method of claim 1 wherein the amorphous carbon-comprising layer comprises at least one of boron or nitrogen.

8. A method of chemical vapor depositing an amorphous carbon-comprising layer on a substrate, comprising:

providing a deposition tool comprising a deposition chamber, a gas output manifold in upstream fluid communication with the deposition chamber, and a remote plasma generator in upstream fluid communication with the gas output manifold; the gas output manifold comprising at least one gas output to the deposition chamber and at least three gas inputs, the at least three gas inputs comprising:

a first gas input line fed by at least a nitrogen deposition precursor source line, a silicon deposition precursor source line, and an oxygen deposition precursor source line;

a second gas input line fed by at least one carbon deposition precursor source line; and a third gas input line fed by the remote plasma generator;

at least one cleaning gas input line feeding the remote plasma generator, the at least one cleaning gas input line comprising an amorphous carbon cleaning gas input and an $Si_3N_4$ or $Si_xO_yN_z$ cleaning gas input;

providing a substrate within the deposition chamber; and flowing a carbon-comprising gas to the gas output manifold through the second gas input effective to deposit an amorphous carbon-comprising layer on the substrate within the deposition chamber and over at least some deposition chamber internal surfaces, the amorphous carbon-comprising layer comprising at least one of boron or nitrogen.

9. The method of claim 8 wherein the carbon-comprising gas is a hydrocarbon and the amorphous carbon-comprising layer is transparent to visible light.

10. The method of claim 8 wherein the flowing the carbon-comprising gas is from the gas output manifold to a gas showerhead received within the deposition chamber.

11. The method of claim 8 wherein the gas output manifold is received externally of the deposition chamber.

12. The method of claim 8 wherein the flowing the carbon-comprising gas is from the gas output manifold to a gas showerhead received within the deposition chamber, and the gas output manifold is received externally of the deposition chamber.

13. A method of chemical vapor depositing an amorphous carbon-comprising layer on a substrate and at least one of $Si_3N_4$ and $Si_xO_yN_z$ on a substrate, comprising:

(a) providing a substrate within a deposition chamber;

(b) depositing a layer comprising $Si_xO_yN_z$, where z is greater than zero, over the substrate within the deposition chamber and over at least some deposition chamber internal surfaces, the depositing of the layer comprising $Si_xO_yN_z$ comprising an inert gas first flow rate which is greater than zero;

(c) depositing a layer comprising amorphous carbon and at least one of boron or nitrogen over the substrate within the deposition chamber and over at least some deposition chamber internal surfaces, (b) and (c) occurring prior to any removing of the substrate from the deposition chamber, the depositing of the layer comprising amorphous carbon comprising an inert gas second flow rate which is greater than zero and is less than the inert gas first flow rate;

(d) after (b) and after (c), removing the substrate from the deposition chamber;

(e) after removing the substrate from the deposition chamber, removing at least some of the at least one of $Si_3N_4$ and $Si_xO_yN_z$ from the deposition chamber internal surfaces with a $Si_3N_4$ and $Si_xO_yN_z$ cleaning gas at subatmospheric pressure; and (f) after removing the substrate from the deposition chamber, removing at least some of the amorphous carbon-comprising layer from the deposition chamber internal surfaces with an amorphous carbon-comprising cleaning gas at subatmospheric pressure, (e) and (f) occurring prior to any exposure of the deposition chamber to room atmospheric pressure after (d).

14. The method of claim 13 wherein (b) occurs before (c).

15. The method of claim 13 wherein (c) occurs before (b).

16. The method of claim 13 wherein (b) deposits hydrogen with the at least one of $Si_3N_4$ and $Si_xO_yN_z$.

17. The method of claim 13 wherein (b) deposits $Si_3N_4$.

18. The method of claim 13 wherein (b) deposits $Si_xO_yN_z$.

19. The method of claim 18 wherein z is greater than zero.

20. The method of claim 13 wherein (c) deposits amorphous carbon which is transparent to visible light.

21. The method of claim 20 wherein (b) occurs before (c).

22. The method of claim 20 wherein (c) occurs before (b).

23. The method of claim 13 wherein the $Si_3N_4$ and $Si_xO_yN_z$ cleaning gas is subjected to remote plasma generation prior to flowing to the deposition chamber.

24. The method of claim 13 wherein the amorphous carbon-comprising layer comprises nitrogen.

25. The method of claim 13 wherein composition of the inert gas during the first and second flow rates is the same.

26. The method of claim 25 wherein the inert gas comprises He.

27. The method of claim 13 wherein the amorphous carbon-comprising layer comprises boron.

28. The method of claim 13 wherein the depositing a layer comprising $Si_xO_yN_z$ comprises feeding $NH_3$ to the substrate.

29. A method of chemical vapor depositing an amorphous carbon-comprising layer on a substrate and at least one of $Si_3N_4$ and $Si_xO_yN_z$ on a substrate, comprising:

(a) providing a deposition tool comprising a deposition chamber, a gas output manifold in upstream fluid communication with the deposition chamber, and a remote plasma generator received externally of the deposition chamber in upstream fluid communication with the gas output manifold;

(b) providing a substrate within the deposition chamber;

(c) flowing a carbon-comprising gas to the gas output manifold effective to deposit an amorphous carbon-comprising layer and at least one of boron or nitrogen on the substrate within the deposition chamber and over at least some deposition chamber internal surfaces;

(d) flowing a silicon deposition precursor and at least one of a nitrogen deposition precursor and an oxygen deposition precursor to the gas output manifold effective to deposit at least one of $Si_3N_4$ and $Si_xO_yN_z$ on the substrate within the deposition chamber and over at least some deposition chamber internal surfaces, (c) and (d) occurring prior to any removing of the substrate from the deposition chamber;

(e) after (c) and after (d), removing the substrate from the deposition chamber;

(f) after removing the substrate from the deposition chamber, flowing an oxygen-containing cleaning gas through the remote plasma generator, into the gas output manifold and into the deposition chamber, and generating a plasma within the deposition chamber with the oxygen-containing cleaning gas effective to remove at least some of the amorphous carbon from the deposition chamber internal surfaces; and (g) after removing the substrate from the deposition chamber, flowing an $Si_3N_4$ or $Si_xO_yN_z$ cleaning gas to the remote plasma generator and generating a remote plasma therefrom, flowing the remote plasma cleaning gas from the remote plasma generator into the gas output manifold and into the deposition chamber effective to remove at least some of the at least one of $Si_3N_4$ and $Si_xO_yN_z$ from the deposition chamber internal surfaces, (f) and (g) occurring prior to any exposure of the deposition chamber to room atmospheric pressure after (e).

30. The method of claim 29 wherein (c) occurs before (d), and (g) occurs before (f).

31. The method of claim 29 wherein (d) occurs before (c), and (f) occurs before (g).

32. The method of claim 29 wherein (d) deposits hydrogen with the at least one of $Si_3N_4$ and $Si_xO_yN_z$.

33. The method of claim 29 wherein (d) deposits $Si_3N_4$.

34. The method of claim 29 wherein (d) deposits $Si_xO_yN_z$.

35. The method of claim 34 wherein z is greater than zero.

36. The method of claim 29 wherein (c) deposits amorphous carbon which is transparent to visible light.

37. The method of claim 29 wherein (d) deposits $Si_xO_yN_z$, z is greater than zero, and (c) deposits amorphous carbon which is transparent to visible light.

38. The method of claim 29 wherein the remote plasma generator generates plasma from and during the oxygen-containing cleaning gas flowing therethrough.

39. The method of claim 29 wherein all the flowings are from the gas output manifold to a gas showerhead received within the deposition chamber, and the gas output manifold is received externally of the deposition chamber.

40. The method of claim 29 wherein (d) deposits $Si_xO_yN_z$ where z is greater than zero, the depositing of the layer comprising $Si_xO_yN_z$ comprising an inert gas first flow rate, the depositing of the layer comprising amorphous carbon comprising an inert gas second flow rate, the inert gas second flow rate being lower than the inert gas second flow rate.

41. The method of claim 40 wherein (c) occurs before (d).

42. The method of claim 40 wherein (d) occurs before (c).

43. The method of claim 29 wherein the nitrogen deposition precursor comprises $NH_3$.

44. The method of claim 29 wherein the carbon-comprising gas $C_3H_6$.

45. A method of chemical vapor depositing an amorphous carbon-comprising layer on a substrate and at least one of $Si_3N_4$ and $Si_xO_yN_z$ on a substrate, comprising:

(a) providing a deposition tool comprising a deposition chamber, a gas output manifold in upstream fluid communication with the deposition chamber, and a remote plasma generator in upstream fluid communication with the gas output manifold;

(b) providing a substrate within the deposition chamber;

(c) flowing a carbon-comprising gas to the gas output manifold effective to deposit an amorphous carbon-comprising layer on the substrate within the deposition chamber and over at least some deposition chamber internal surfaces;

(d) flowing a silicon deposition precursor and at least one of a nitrogen deposition precursor and an oxygen deposition precursor to the gas output manifold effective to deposit at least one of $Si_3N_4$ and $Si_xO_yN_z$ on the substrate within the deposition chamber and over at least some deposition chamber internal surfaces, (c) and (d) occurring prior to any removing of the substrate from the deposition chamber;

(e) after (c) and after (d), removing the substrate from the deposition chamber;

(f) after removing the substrate from the deposition chamber, flowing an oxygen-containing cleaning gas through the remote plasma generator, into the gas output manifold and into the deposition chamber, and generating a plasma within the deposition chamber with the oxygen-containing cleaning gas effective to remove at least some of the amorphous carbon from the deposition chamber internal surfaces; the remote plasma generator not generating plasma during flowing the oxygen-containing cleaning gas therethrough; and (g) after removing the substrate from the deposition chamber, flowing an $Si_3N_4$ or $Si_xO_yN_z$ cleaning gas to the remote plasma generator and generating a remote plasma therefrom, flowing the remote plasma cleaning gas from the remote plasma generator into the gas output manifold and into the deposition chamber effective to remove at least some of the at least one of $Si_3N_4$ and $Si_xO_yN_z$ from the deposition chamber internal surfaces, (f) and (g) occurring prior to any exposure of the deposition chamber to room atmospheric pressure after (e).

46. The method of claim 45 wherein, (d) deposits $Si_xO_yN_z$, z is greater than zero, and (c) deposits amorphous carbon which is transparent to visible light.

47. The method of claim 46 wherein all the flowings are from the gas output manifold to a gas showerhead received within the deposition chamber, and the gas output manifold is received externally of the deposition chamber.

48. A method of chemical vapor depositing an amorphous carbon-comprising layer on a substrate and at least one of $Si_3N_4$ and $Si_xO_yN_z$ on a substrate, comprising:

(a) providing a deposition tool comprising a deposition chamber, a gas output manifold in upstream fluid communication with the deposition chamber, and a remote plasma generator in upstream fluid communication with the gas output manifold;

(b) providing a substrate within the deposition chamber;

(c) flowing a carbon-comprising gas to the gas output manifold effective to deposit an amorphous carbon-comprising layer on the substrate within the deposition chamber and over at least some deposition chamber internal surfaces, the amorphous carbon-comprising layer comprising at least one of boron or nitrogen;

(d) flowing a silicon deposition precursor and at least one of a nitrogen deposition precursor and an oxygen deposition precursor to the gas output manifold effective to deposit at least one of and $Si_xO_yN_z$ on the substrate within the deposition chamber and over at least some deposition chamber internal surfaces, (c) and (d) occurring prior to any removing of the substrate from the deposition chamber;

(e) after (c) and after (d), removing the substrate from the deposition chamber;

(f) after removing the substrate from the deposition chamber, flowing an oxygen-containing cleaning gas through the remote plasma generator, into the gas output manifold and into the deposition chamber, and generating a plasma within the deposition chamber with the oxygen-containing cleaning gas effective to remove at least some of the amorphous carbon from the deposition chamber internal surfaces; and (g) after removing the substrate from the deposition chamber, flowing an $Si_3N_4$ or $Si_xO_yN_z$ cleaning gas to the remote plasma generator and generating a remote plasma therefrom, flowing the remote plasma cleaning gas from the remote plasma generator into the gas output manifold and into the deposition chamber effective to remove at least some of the at least one of $Si_3N_4$ and $Si_xO_yN_z$ from the deposition chamber internal surfaces, (f) and (g) occurring prior to any exposure of the deposition chamber to room atmospheric pressure after (e).

49. A method of chemical vapor depositing an amorphous carbon-comprising layer on a substrate and at least one of $Si_3N_4$ and $Si_xO_yN_z$ on a substrate, comprising:

(a) providing a deposition tool comprising a deposition chamber, a gas output manifold in upstream fluid communication with the deposition chamber, and a remote plasma generator in upstream fluid communication with the gas output manifold; the gas output manifold comprising at least one gas output to the deposition chamber and at least three gas inputs, the at least three gas inputs comprising:

a first gas input line fed by at least a nitrogen deposition precursor source line, a silicon deposition precursor source line, and an oxygen deposition precursor source line;

a second gas input line fed by at least one carbon deposition precursor source line; and a third gas input line fed by the remote plasma generator at least one cleaning gas input line feeding the remote plasma generator, the at least one cleaning gas input line comprising an amorphous carbon cleaning gas input and an $Si_3N_4$ or $Si_xO_yN_z$ cleaning gas input;

(b) providing a substrate within the deposition chamber;

(c) flowing a carbon-comprising gas to the gas output manifold through the second gas input effective to deposit an amorphous carbon-comprising layer on the substrate within the deposition chamber and over at least some deposition chamber internal surfaces;

(d) flowing a silicon deposition precursor and at least one of a nitrogen deposition precursor and an oxygen deposition precursor through the first gas input line to the gas output manifold effective to deposit at least one of $Si_3N_4$ and $Si_xO_yN_z$ on the substrate within the deposition chamber and over at least some deposition chamber internal surfaces, (c) and (d) occurring prior to any removing of the substrate from the deposition chamber;

(e) after (c) and after (d), removing the substrate from the deposition chamber;

(f) after removing the substrate from the deposition chamber, flowing an oxygen-containing cleaning gas through the remote plasma generator, into the gas output manifold and into the deposition chamber, and generating a plasma within the deposition chamber with the oxygen-containing cleaning gas effective to remove at least some of the amorphous carbon from the deposition chamber internal surfaces; and (g) after removing the substrate from the deposition chamber, flowing an $Si_3N_4$ or $Si_xO_yN_z$ cleaning gas to the remote plasma generator and generating a remote plasma therefrom, flowing the remote plasma cleaning gas from the remote plasma generator into the gas output manifold and into the deposition chamber effective to remove at least some of the at least one of $Si_3N_4$ and $Si_xO_yN_z$ from the deposition chamber internal surfaces, (f) and (g) occurring prior to any exposure of the deposition chamber to room atmospheric pressure after (e).

50. The method of claim 49 wherein (c) occurs before (d), and (g) occurs before (f).

51. The method of claim 49 wherein (d) occurs before (c), and (f) occurs before (g).

52. The method of claim 49 wherein (d) deposits hydrogen with at least one of $Si_3N_4$ and $Si_xO_yN_z$.

53. The method of claim 49 wherein (d) deposits $Si_3N_4$.

54. The method of claim 49 wherein (d) deposits $Si_xO_yN_z$.

55. The method of claim 54 wherein z is greater than zero.

56. The method of claim 49 wherein (c) deposits amorphous carbon which is transparent to visible light.

57. The method of claim 49 wherein the remote plasma generator does not generate plasma during the oxygen-containing cleaning gas flowing therethrough.

58. The method of claim 49 wherein all the flowings are from the gas output manifold to a gas showerhead received within the deposition chamber, and the gas output manifold is received externally of the deposition chamber.

59. The method of claim 49 wherein the amorphous carbon-comprising layer comprises at least one of boron or nitrogen.

60. The method of claim 49 wherein (d) deposits $Si_xO_yN_z$ where z is greater than zero, the depositing of the layer comprising $Si_xO_yN_z$ comprising an inert gas first flow rate, the depositing of the layer comprising amorphous carbon comprising an inert gas second flow rate, the inert gas second flow rate being lower than the inert gas second flow rate.

* * * * *

UNITED STATES PATENT AND TRADEMARK OFFICE

CERTIFICATE OF CORRECTION

PATENT NO. : 7,354,631 B2
APPLICATION NO. : 10/704315
DATED : April 8, 2008
INVENTOR(S) : Fuss et al.

It is certified that error appears in the above-identified patent and that said Letters Patent is hereby corrected as shown below:

In column 16, line 7, in Claim 48, after "of" insert -- $Si_3N_4$ --.

In column 16, line 51, in Claim 49, after "generator" insert -- ; --.

In column 16, lines 51–55, in Claim 49, delete "at least one cleaning gas input line feeding the remote plasma generator, the at least one cleaning gas input line comprising an amorphous carbon cleaning gas input and an $Si_3N_4$ or $Si_xO_yN_z$ cleaning gas input;" and insert the same on Line 52 as a new paragraph.

In column 18, line 2, in Claim 52, after "with" insert -- the --.

Signed and Sealed this

First Day of July, 2008

JON W. DUDAS
*Director of the United States Patent and Trademark Office*